United States Patent [19]

Liang et al.

[11] Patent Number: 4,970,193

[45] Date of Patent: Nov. 13, 1990

[54] DEVELOPER COMPOSITION HAVING IMPROVED BLOCKING RESISTANCE

[75] Inventors: Rong-Chang Liang, Centerville; Carolyn Greene, Mogadore, both of Ohio

[73] Assignee: The Mead Corporation, Dayton, Ohio

[21] Appl. No.: 245,477

[22] Filed: Sep. 16, 1988

[51] Int. Cl.$^5$ .......................... B41M 5/16; B41M 5/18; B41M 5/22; G03C 1/72
[52] U.S. Cl. ..................................... 503/201; 430/138; 503/210; 503/211; 503/212; 503/215; 503/216; 503/225
[58] Field of Search ................................ 427/150–152; 430/138; 428/913, 914; 503/215–217, 225, 201, 210–212

[56] References Cited

U.S. PATENT DOCUMENTS 4,772,532 9/1988 Adair et al. .......................... 430/138
4,853,364 1/1989 Liang et al. .......................... 503/216

Primary Examiner—Bruce H. Hess
Attorney, Agent, or Firm—Thompson, Hine and Flory

[57] ABSTRACT

A developer composition having improved resistance to vinyl blocking comprising a finely divided thermoplastic phenolic resin and a finely divided thermoplastic vinylic or acrylic resin;
  the vinylic or acrylic resin is prepared from a monomer composition containing a polar monomer which renders the composition resistant to vinyl plasticizers;
  developer sheets prepared from the developer composition and processes for forming images utilizing the developer composition are disclosed.

33 Claims, No Drawings

DEVELOPER COMPOSITION HAVING IMPROVED BLOCKING RESISTANCE

BACKGROUND OF THE INVENTION

The present invention relates to a developer composition which is capable of providing visible images through reaction with an electron donating color precursor and which is useful in providing transparencies or in providing copies having a glossy or semi-glossy finish. More particularly, the present invention provides a developer composition which is resistant to blocking when stored in a vinyl binder.

The developer sheet of the present invention can be used in conjunction with imaging systems in which visible images are formed by image-wise transferring a color precursor to a developer sheet. These imaging systems include conventional pressure-sensitive copy paper, photosensitive imaging systems and thermal recording papers.

Pressure-sensitive copy paper is well known in the art. It is described in U S. Pat. Nos. 2,550,446; 2,712,507; 2,703,456; 3,016,308; 3,170,809; 3,455,721; 3,466,184; 3,672,935; 3,955,025; and 3,981,523.

Photosensitive imaging systems employing microencapsulated radiation sensitive compositions containing color precursors are described in commonly assigned U.S. Pat. Nos. 4,399,209 and 4,440,846, among others. In its most typical embodiments, the photosensitive composition is a photopolymerizable composition including a polyethylenically unsaturated compound and a photoinitiator which is encapsulated with a color precursor. Exposure of the microcapsules to actinic radiation hardens the internal phase. Following the exposure, the imaging sheet is subjected to pressure in contact with a developer sheet by passage through the nip between a pair of pressure rollers whereupon the color precursor is image-wise transferred to the developer sheet where it reacts to form the image.

Thermal transfer systems are described in Japanese Published Application 62-60694.

In applications in which the aforementioned imaging systems are used to reproduce photographic quality images, a high degree of gloss is often desired in the reproduction. Where a transparency is desired, the reproduction must also transmit light efficiently. These objectives are difficult to achieve using conventional developers.

Developers which are capable of glossing are described in commonly assigned U.S. application Ser. No. 905,727, filed Sept. 9, 1986, now abandoned, and U.S. application Ser. No. 086,059, filed Aug. 14, 1987, now U.S. Pat. No. 4,877,767. Both applications describe a developer sheet having a layer of a finely divided thermoplastic acidic resin developer on the surface. The capillary network formed by the interstitial spaces among the finely divided resin particles functions to draw the color precursor into the developer layer where the resin reacts with the color precursor to form the image. Subsequent heating coalesces the resin into a glossimparting film. In the former application the resins are phenolic resins. In the latter application they are acrylic microparticles formed by emulsion or suspension polymerization with a core-shell construction which provides unique melting characteristics.

One of the drawbacks of previous glossable developer materials is a tendency to block when they are stored in a vinyl binder. This blocking is due to plasticizers in the vinyl, such as dibutyl phthalate, dioctyl phthalate, and tricresyl phthalate, migrating from the vinyl binder cover to the developer layer and softening the developer composition. Over a period of several weeks, sufficient vinyl plasticizer has diffused from the binder to weaken the developer layer to such an extent that the adhesive strength between the developer layer and the binder becomes greater than the cohesive strength of the developer layer. When this occurs pick-off is observed as the developer sheet is separated from the vinyl.

An improved developer composition is described in commonly assigned U.S. application Ser. No. 152,685, filed Feb. 5, 1988, now U.S. Pat. No. 4,853,364, wherein the resins described in the aforementioned applications are combined. The phenolic resins described in the former application provide good density but have a tendency to be tacky and exhibit a high yellowing index, poor adhesion and cohesion, and tend to scratch easily. The acrylic developers described in the latter application exhibit good abrasion resistance but generally do not provide as high density as can be achieved with the phenolic resins. By modifying the acrylic resin to make it compatible with the phenolic resin and combining the two resins, a developer composition is achieved having the combined properties of good density and adhesive and cohesive strength. Even this composition, however, does not provide the vinyl blocking resistance which would be desired.

SUMMARY OF THE INVENTION

A principal object of the present invention is to provide a novel developer composition which provides good density, adhesive and cohesive strength and vinyl blocking resistance.

The developer composition of the present invention comprises a finely divided thermoplastic phenolic developer resin and a finely divided thermoplastic vinylic or acrylic resin which is derived from a monomer composition which includes a monomer having a high polar character (as reflected in a high dipole moment) and a polyfunctional monomer such as divinylbenzene, 1,6-hexanediol diacrylate, N-methylolacrylamide, N,N-methylenebis acrylamide, etc. The phenolic and vinylic or acrylic resins are further characterized in that upon heating a mixture of the two, they coalesce with one another and form a continuous film.

As explained in related application Ser. No. 152,685, phenolic resins and acrylic or vinylic resins must be compatible such that the two resins will coalesce and form a continuous film. Furthermore, for use in transparencies, the indices of refraction of the two resins must be sufficiently well matched that the coalesced film appears transparent. If the indices of refraction are not well matched, the coalesced film appears hazy. This is not a problem if the developer is used on paper but it is not desirable in a transparency.

In addition to being compatible and preferably having matched refractive indices, the phenolic and acrylic resins should have a low melt flow temperature (MFT) (e.g., 100° to 130° C.) such that the resins can be coalesced with little heating and a sufficiently high minimum film forming temperature (MFFT) (e.g., 60° to 80° C.) that the resins will not coalesce inadvertently upon drying.

U.S. application Ser. No. 086,059 teaches that the aforementioned properties are difficult to achieve in a single polymer and, as such, a practice has been developed of forming a microparticle by multi-stage emulsion or suspension polymerization. This enables one to provide a developer having a unique combination of properties. A developer particle can be designed having a core and one or more shells (hereinafter a core-shell construction) in which the composition of the core is different than the composition of the shell or shells. Compatibility with the phenolic resin can be built into the outer or outermost shell(s) of the particle. The shell(s) can be designed with a higher capacity for hydrogen bonding and with a higher concentration of developer moieties which provides compatibility with the phenolic resin and improved density. In addition, the shell(s) can be formed from a resinous material having a sufficiently high MFFT that the particle does not melt as the developer sheet is dried during its manufacture.

On the other hand, the core of a core-shell construction can be formed from a resin having a lower MFT, which reduces the temperature and the amount of heat (or heating time) required to coalesce the developer for glossing. In addition, in making developers for transparencies, the core can be formed from a resin which exhibits an index of refraction which essentially matches the index of refraction of the phenolic resin.

In accordance with the present invention, improved resins are used in forming the acrylic or vinylic microparticle which provide vinyl blocking resistance. This is achieved by incorporating multifunctional monomers and monomers having a high dipole moment into the resins.

DEFINITIONS

The term "core-shell" refers to a microparticle v having a core potion and one or more concentric shell portions.

The term "(meth)acrylic" means acrylic or methacrylic in the alternative.

The term "compatible" means that upon heating, the developers coalesce to form essentially a single phase.

"Minimum film forming temperature" is determined in accordance with ASTM D5354.

Unless otherwise indicated all parts and percents are by weight.

Detailed Description of the Invention

The acrylic or vinylic microparticles used in the present invention are characterized in that they are formed from resins which include a monomer having a high dipole. This monomer renders the resin, when coalesced, resistant to the vinyl plasticizer. By selecting monomers having a strongly polar effect as evidenced by a dipole moment greater than 3D or a solubility parameter greater than 10 (cal/cm$^3$)$^{\frac{1}{2}}$, a resin is produced which is incompatible with the plasticizer. Consequently, the plasticizer does not have an affinity for the resin and the resin resists infiltration by the plasticizer when stored in contact with a vinyl surface as in a binder.

The most typical example of a polar monomer having a high dipole moment for use in the present invention is acrylonitrile. Other monomers having a high dipole moment which may be useful in the present invention include the following: acrylic acid, methacrylic acid, acrylamide and methacrylamide, itaconic acid and maleic anhydride.

As explained above, blocking is also attributed to a breakdown in the cohesive strength of the developer layer which accompanies penetration of the developer layer by the vinyl plasticizer. In addition to incorporating a polar monomer into the resins, blocking resistance can also be enhanced by incorporating polyfunctional monomers (e.g., polyethylenically unsaturated monomers) into the acrylic or vinylic resin to enhance crosslinking and thereby increase cohesive strength. Examples of useful polyfunctional monomers include divinylbenzene, 1,6-hexanediol diacrylate, etc. In addition to divinyl benzene, diacrylate and triacrylate monomers such as hexane diacrylate, zinc diacrylate, and zinc dimethacrylate, diacrylamides, N-methylolacrylamide, N-(iso-butoxymethyl)acrylamide allylacrylate, etc., may be used to improve cohesive strength through cross-linking. Polyfunctional monomers such as trimethylol propane triacrylate and other esters of acrylic or methacrylic acid derived from polyfunctional alcohols are not desirable because the resin tends to become too highly crosslinked.

Substantially any monomer which is copolymerizable with the aforesaid monomers to produce copolymers are useful in the present invention. Copolymerizable monomers that may be used are most typically acrylic or methacrylic acid, alkyl (meth)acrylates and vinyl monomers such as styrene, vinylacetate, vinylidene chloride, acrylic or methacrylic acid esters having 1 to 12 carbon atoms in the ester moiety, hydroxy alkyl (meth)acrylates, styrene sulfonate salts, vinyl sulfonate salts, vinylbenzoic acid, acryloxloyl monophthalate, or o-acryloxloyl benzoic acid. The monomer is preferably but not necessarily water insoluble.

In accordance with the present invention, an acrylic or vinylic microparticle having a core-shell construction is preferably used in which the core has a lower MFFT and MFT than the shell such that upon drying, the higher MFFT of the shell prevents the developer particles from coalescing, and upon glossing the lower MFT of the core enables the core to melt readily, plasticize the shell and reduce the temperature and amount of heat required to coalesce the developer.

The shell and core properties are easily adjusted during the emulsion polymerization process. The index of refraction and the MFT and MFFT of the resin can be predicted mathematically based on the Tg and index of refraction of the monomers making up the resin and the amounts in which they are used. For example, the Tg of acrylic resins which correlates to MFT and MFFT, can be predicted based on the Fox equation (Eq. 1):

$$\frac{1}{Tg(f)} = \sum_i \frac{Xi}{Tgi} \quad \text{(Eq. 1)}$$

where Xi is the weight fraction of the monomer i and Tg is the glass transition temperature of the homopolymer i in °K.

The shell polymer composition should be optimized to provide good developing activity, prevent coalescence upon drying, provide good handling characteristics and provide compatibility with the phenolic resin. The shell polymer preferably has a melt flow temperature (MFT) of about 100° to 150° C. and preferably about 115° to 125° C. The core polymers preferably has an MFT of about 0° to 115° C. The resulting particle preferably has a MFFT of abut 60° to 80° C. This enables the developer layer to be dried efficiently, limits tack, and allows the developer layer to be coalesced readily at temperatures below 130° C. If the shell polymer has a substantially lower melt flow temperature, the developer microparticles may coalesce prematurely at the time of drying. If the melt flow temperature is too high, excessive time and heat may be required to coalesce the microparticles.

The MFT and MFFT of the shell resin composition can be controlled based on Eq. 1. For example, long chain alkyl (meth)acrylates have a lower Tg than short chain acrylates or methacrylates and will generally be used in higher amounts in the core than the shell to give the core a lower melting characteristic. Styrene, which is used in the resin to increase its refractive index, and acrylonitrile have Tg of about 100° C. and 96° C. respectively. Accordingly, lower melting monomers are used in both the core and the shell to bring the MFT and MFFT down to an appropriate level but higher concentratons of these monomers will be used in the core where a lower MFT is desired than in the shell where a high MFFT is desired. It is also desirable to include about 0.5 to 6 wt% of acrylic or methacrylic acid and other ionizable monomers, e.g., sodium styrene sulfonate, vinyl sulfonate in the shell because they are ionic and stabilize the emulsion and they also catalyze dye development during image formation.

In addition, the resin composition in the shell is designed to be compatible with the phenolic resin such that when the two resins melt they coalesce into a strong continuous film. Typically, compatibility between the acrylic and phenolic resin is established by incorporating a substantial amount of monomers which form hydrogen bonds with phenolic resins into the acrylic composition such as lower alkyl (meth)acrylates, (meth)acrylonitrile, or hydroxyalkyl (meth)acrylates such as hydroxyethyl (meth)acrylate. Concurrently, the composition of the resins in the core and the shell(s) are adjusted such that they are also compatible. In this manner, a continuum of properties is achieved between the core and shell yields uniform film formation and high strength.

For use in transparencies, the refractive index of the microparticle should essentially match the refractive index of the phenolic resin. The refractive index can be predicted based on Eq. 2:

$$\eta_{D(f)} = \sum_i \eta_{Di} X_i$$

where $\eta_D$ is the refractive index of the monomer and $X_i$ is its weight fraction.

Because the refractive index of (meth)acrylates is about 1.45 to 1.50 and phenolic resins have a refractive index of about 1.5 to 1.7, in order to match refractive indices it is necessary to form copolymers of meth(acrylic) acid or esters with comonomers providing higher refractive indices. Polystyrene has a refractive index of 1.59. Hence, copolymers of styrene and (meth)acrylic acids and/or esters are typically used in the core resin. On the other hand, polystyrene is not compatible with many phenolic resins. Therefore, to match refractive indices and at the same time maintain compatibility, a core-shell composition has been designed in which a high concentration (e.g., 40 to 60%) of styrene is present in the core resin and a low concentration of styrene is present in the outermost compatible shell resin (some styrene is present in the outermost shell to ensure polymerization of the acrylonitrile). With acrylonitrile ($\eta_D = 1.571$) less sytrene may be used. While the refractive index of the microparticle shell may not exactly match the refractive index of the phenolic resin, this does not appear to adversely compromise transparency. Apparently there is sufficient mixing of the two resins at the interface that any effect due to the small differences in refractive index is minimized.

Monomers useful in increasing the refractive index of a (meth)acrylate copolymer include styrene, phenyl (meth)acrylate, benzyl (meth)acrylate, vinylidene chloride, vinyl benzoate, acrylonitrile, and others. These latter monomers are generally selected on the basis that homopolymers of the monomers have refractive indices greater than about 1.55.

Acidic comonomers may be used in the shell to stabilize the particle during polymerization and to enhance developing activity. Representative examples of acidic comonomers include acrylic acid, methacrylic acid, maleic acid itaconic acid, vinyl benzoic acid, acryloyloxyethyl monophthalate, o-acryloyloxybenzoic acid, etc. Examples of acrylates and methacrylates include methyl (meth)acrylate, isobutyl (meth)acrylate, n-butyl (meth)acrylate, ethylhexyl acrylate, ethyl acrylate, etc.

The ratio of the amount of acrylic or vinylic resin microparticles to the amount of the phenolic resin will vary depending upon the composition of the microparticles and the nature of the phenolic resin. In general, sufficient acrylic or vinylic resin must be present to prevent vinyl blocking. This amount will be a function of the polar character and cohesive strength of the acrylic or vinylic resin. The polar character of the acrylic or vinylic resin is in large part determined by the amount of the polar monomer present. Its cohesive strength is a product of a number of factors one of which is the amount of polyfunctional monomer. Typically the weight ratio of the phenolic resin to the vinylic or acrylic resin ranges from 90/10 to 40/60.

It has been found that particularly useful acrylic resins contain about 15 to 35% by wt. and preferably 20 to 30% by wt. of a polar monomer and particularly acrylonitrile. In addition, these resins preferably contain about 0.1 to 0.5% by weight of a polyfunctional monomer such as divinylbenzene. When used with a phenolic resin which is a condensation product of a p-alkyl substituted phenol, formaldehyde and a salicylic acid, the developer composition may contain about 10 to 40% and preferably 25 to 35% of the acrylic or vinylic resin and about 65 to 75% of the phenolic resin. When used with a phenolic resin prepared by oxidatively coupling a p-alkyl substituted phenol, the developer may contain about 10 to 30% of the acrylic or vinylic resin and about 70 to 90% of the phenolic resin to achieve sufficient vinyl blocking resistance.

A particularly preferred acrylic resin useful in the present invention is prepared by emulsion polymerization of the following monomers in the amounts indicated:

| Monomer | Range (%) |
| --- | --- |
| Methyl Methacrylate | 2–11 |
| Styrene | 40–60 |
| Acrylonitrile | 15–35 |
| Butyl Acrylate | 6–12 |
| Butyl Methacrylate | 10–25 |
| Hydroxyethyl Methacrylate | 0–3 |
| Methacrylic Acid | 1–6 |
| Divinylbenzene | 0.1–0.5 |

-continued

| Monomer | Range (%) |
|---|---|
| Sodium Styrene Sulfonate | 0-1 |

As explained above, styrene is used to raise the refractive index of the resin to a level at which it approaches and preferably equals the refractive index of the phenolic resin. Acrylonitrile is used in an amount which makes the resin sufficiently polar to be plasticizer resistant. Butyl acrylate and butyl methacrylate are used to control MFT and MFFT. They have a lower Tg and are used in amounts that balance the MFT and MFFT properties as discussed above. For blends with phenol-formaldehyde resins, more MAA (up to 6%) is preferred. But for a polyphenolic resin, MAA is not used because it will cause unstability of the blend (Zn Salicylate). Sodium styrene sulfonate is used in this case to replace MAA. Divinylbenzene is a polyfunctional monomer added to enhance cohesive strength.

Based upon the foregoing teachings, acrylic and vinylic resins can be prepared with specified melt flow temperatures (MFT), e.g., 80° to 130° C. (pressure free, 1 minute) and with specified minimum film forming temperatures (MFFT, ASTM D5354) e.g., 60°-80° C. Water based coatings of these resins can be oven dried at temperatures of about 60 -80° C. for a short period of time without coalescence and the developer can still be readily coalesced after reaction with the color former by heating to temperatures of about 100°-130° C.

Emulsion polymerization usually requires the use of an appropriate surfactant and/or protective colloid to stabilize the emulsion and control the size of the microparticles. These materials are commonly referred to as emulsion stabilizers and dispersing agents. Those surfactants or protective colloids which are normally used in the emulsion polymerization of acrylates may be used herein. Representative examples include sodium dodecylbenzene sulfonate, ethylene oxide adducts of alkylphenols. Hydroxyethyl cellulose and polyvinyl pyrrolidone (PVP) are particularly desirable as protective colloids. Conventional catalysts or initiators for the polymerization of acrylates are useful herein such as cumene hydroperoxide, hydrogen peroxide, azobisisobutynonitrile, potassium or ammonium persulfate, t-butyl hydroperoxide, etc. Catalyst concentration may range from about 0.1 to 1% by weight.

The surfactants and initiators can be varied in the course of the polymerization process to produce modifications in the properties of the microparticle. Emulsion polymerization processes have been conducted in from 2 to 6 stages. It is desirable to conduct the polymerization in a large number of stages in order to achieve a gradual transition or gradient from the properties and composition of the core polymer to the properties and composition of the outermost shell polymer.

A metal (e.g., zinc) salt can also be post-mixed with the acrylic or vinylic developer to enhance its activity as a developer. By providing acrylic or methacrylic acid groups in the shell, the zinc salt can chelate with the developer particle and thereby enhance its activity. Useful salts are known in the art and are described in U.S. Pat. Nos. 3,864,146 to Oda et al. among other references. The salt may be incorporated into the developer composition in an amount of about 10 to 30% by weight. In applications in which high adhesive strength is required, the phenolic resin may only be present in an amount of 40 to 50 parts per 50 to 60 parts of the acrylic resin. This reduces developing activity unless a compound such as zinc salicylate is added to the developer composition.

In another method, developer materials which are monomer soluble but not soluble in the developer resin can be added to an emulsion polymerization system prior to polymerization such that the compounds become entrained in the acrylic or vinylic developer resin during the polymerization process. Water soluble materials such as zinc chloride or zinc acetate can be added directly to the emulsion prior to coating. Generally, these materials may be added in an amount ranging from about 0 to 10 parts per 100 parts resin. They increase density, improve abrasion resistance and reduce tackiness.

The phenolic developers used as one component of the developer composition of the present invention preferably range from about 0.1 to 25 microns in particle size and preferably have a minimum film forming temperature greater than about 60° C. and a melt flow temperature less than about 135° C.

Many phenolic resins conventionally used as developer materials in pressure-sensitive recording materials are useful in the present invention. These resins may be the condensation product of phenols (including substituted phenols) and formaldehyde. The resins may be further modified to include amounts of salicylic acids or substituted salicylic acids to enhance image density in a manner known in the art.

Examples of phenolic resins useful in the present invention are described in U.S. Pat. Nos. 3,455,721; 3,466,184; 3,762,935; 4,025,490; and 4,226,962.

Another class of phenolic resin useful in the present invention is the product of oxidative couping of substituted or unsubstituted phenols or biphenols. Oxidative coupling may be performed using various catalysts but a particularly desirable catalyst is the enzyme, horseradish peroxidase. A particularly desirable phenolic resin is described in commonly assigned U.S. Pat. No. 4,647,952. A still more particularly useful resin is prepared by oxidative coupling Bisphenol A with hydrogen peroxide in the presence of horseradish peroxidase. This reaction can be carried out in a mixed solvent of water, acetone, and ethylacetate. After reaction the resin can be pulverized and ground in water with zinc salicylate and salicylic acid to prepare a finely divided particle useful in the present invention.

Another preferred phenolic developer is a condensation product of formaldehyde and an alkylphenol, such as an alkylphenol monosubstituted by an alkyl group which may contain 1 to 12 carbon atoms. Examples of alkyl phenols are ortho- or para- substituted ethylphenol, propylphenol, butylphenol, amylphenol, hexylphenol, heptylphenol, octylphenol, nonylphenol, t-butylphenol, t-octylphenol, etc. These resins are preferably metallated by reaction with a metal salt selected from the group consisting of copper, zinc, aluminum, tin, cobalt and nickel salts. Most typically, the resins are zincated to improve development. The metal content of the resins generally is about 1 to 5% by weight but may range up to 15%. Examples of these resins are provided in U.S. Pat. No. 4,173,684 to Stolfo and 4,226,962 to Stolfo.

Another class of thermoplastic phenolic developer material is a resin-like condensation product of a polyvalent metal salt, such as a zinc salt, and a phenol, a phenol-formaldehyde condensation product, or a phenolsalicylic acid-formaldehyde condensation product. Examples of this developer material are available from Schenectady Chemical Inc. under the designations HRJ 4250, HRJ 4252, and HRJ 4542. These products are reported to be a metallated condensation product of an ortho- or para-substituted alkylphenol, a substituted salicylic acid, and formaldehyde.

Phenolic developer materials useful in the present invention may be formed into particles useful in the present invention by several processes. A developer material can be prepared in a conventional manner and ground, or a melt of the material can be atomized. Alternatively, a melt of the developer material can be injected into a rapidly agitated aqueous medium whereupon the melt is solidified as droplets which are recovered. The developer material can also be dissolved in a solvent/non-solvent system and the solvent (which is lower boiling than the non-solvent) removed. Other materials such as Schenectady HRJ 4250, HRJ 4252 and HRJ 4542 resins are obtained commercially in a dispersed form.

Where the developer composition is mixed with a binder for coating, useful binders include butadiene copolymers, styrene copolymers, α-methylstyrene copolymers, polyvinyl chloride and vinylidene chloride copolymers, carboxylated styrene-butadiene copolymers, acrylate copolymers, etc. The binder may be incorporated in the formulation in an amount of about 0.5 to 20 parts by weight developer per 100 parts developer.

In the case of developer resin emulsions, a water soluble binder of polyvinyl alcohol, hydroxyethyl cellulose, carboxymethyl cellulose, polyacrylic acid, polyvinyl pyrrolidone, polyvinyl phenol copolymers, etc. is used. A typical binder/resin ratio is about 0.5/100 to 5/100.

Useful substrates for developer sheets of the present invention include paper, synthetic papers, and transparent films such as polyethylene terephthalate and cellulose film. Paper weight and film thickness will vary with the particular application.

The resin is preferably applied to the substrate in a dry coat weight of about 5 to 20 g/sq.cm.

The present invention is illustrated in more detail by the following non-limiting Examples.

EXAMPLES

Preparation of Seed Emulsion A

The emulsions shown in Table 1 were prepared as outlined below.

TABLE 1

| | Initial Charge | Pre-emulsion I | Pre-emulsion II |
|---|---|---|---|
| Styrene | 24.2 | 66.8 | 71 |
| Acrylonitrile | 7.2 | 20 | 22.2 |
| 2-Ethylhexyl Acrylate | 14.7 | — | — |
| Butyl Acrylate | — | 34.3 | 27.1 |
| Butyl Methacrylate | — | 7.7 | 23.2 |
| Divinyl Benzene | — | 0.13 | 0.14 |

TABLE 1-continued

| | Initial Charge | Pre-emulsion I | Pre-emulsion II |
|---|---|---|---|
| n-Docecyl Mercaptan | 0.14 | 0.4 | 0.43 |
| Methacrylic Acid | 0.46 | 1.3 | 1.43 |
| 2-Hydroxyethyl Methacrylate | 1.38 | 3.9 | 4.3 |
| Sodium Styrene Sulfonate | — | — | — |
| 2% Hydroxyethyl Celluose | 3.84 | — | — |
| Surfactant | 4.56 | 3.36 | 3.29 |
| Sodium Acetate | 0.64 | — | — |
| H$_2$O | 80 | 81 | 91 |

The Initial Charge was placed in a reactor and stirred while heating to 65° C. Thereafter, 0.7 g ammonium persulfate and 3.3 g water were added to the initial charge and heating was continued to about 76° C. Pre-Emulsion I was then drop-wise added to the reactor over a period of 1.5 hours while maintaining the temperature at about 76° C. Following the addition of Pre-Emulsion I, a solution of 0.16 g ammonium persulfate in 2 g water was added to the reactor and Pre-Emulsion II was added drop-wise over a period of two hours. After the addition of Pre-Emulsion II, a solution of 0.16 g ammonium per sulfate in 2 g water was added to the reactor and the contents of the reactor were heated to about 80° C. at which temperature the reactor was maintained for 1 hour. The emulsion (hereafter referred to as Seed Emulsion A) had a solid content of 48%, an average particle size of 0.2–0.5 micron and excellent stability.

Preparation of Seed Emulsion B

Using the same procedure used for Seed Emuslion A, Seed Emulsion B was prepared using the emulsions shown in Table 2.

TABLE 2

| | Initial Charge | Pre-emulsion I | Pre-emulsion II |
|---|---|---|---|
| Styrene | 24.2 | 66.8 | 71 |
| Acrylonitrile | 7.2 | 20 | 22.2 |
| 2-Ethylhexyl Acrylate | 14.7 | — | — |
| Butyl Acrylate | — | 34.3 | 27.1 |
| Butyl Methacrylate | — | 7.7 | 23.2 |
| Divinyl Benzene | — | 0.13 | 0.14 |
| n-Docecyl Mercaptan | 0.14 | 0.4 | 0.43 |
| 2-Hydroxyethyl Methacrylate | 1.38 | 3.9 | 4.3 |
| Sodium Styrene Sulfonate | 0.46 | 1.3 | 1.43 |
| 2% Hydroxyethyl Celluose | 3.84 | — | — |
| Surfactant | 4.56 | 3.36 | 3.29 |
| Sodium Acetate | 0.64 | — | — |
| H$_2$O | 80 | 81 | 91 |

Preparation of Seed Emulsions

The emulsions shown in Table 3 were prepared using the amounts of styrene, acrylonitrile and methyl methacrylate (MMA) shown in Table 4.

TABLE 3

| | Initial Charge | Pre-emulsion I | Pre-emulsion II | Pre-emulsion III |
|---|---|---|---|---|
| Seed Emulsion (A) | 47.2 | — | — | — |
| Styrene | Table 4 | Table 4 | Table 4 | 10.0 |
| Acrylonitrile | Table 4 | Table 4 | Table 4 | Table 4 |
| Butyl Acrylate | 1.83 | 19.3 | 22.53 | 5.3 |
| Butyl Methacrylate | 1.64 | 17.3 | — | — |
| Divinyl Benzene | — | 0.24 | 0.33 | 0.05 |

TABLE 3-continued

| | Initial Charge | Pre-emulsion I | Pre-emulsion II | Pre-emulsion III |
|---|---|---|---|---|
| n-docecyl Mercaptan | — | 0.36 | 0.39 | 0.16 |
| Methacrylic Acid | 0.11 | 1.18 | 1.3 | 0.53 |
| 2-hydroxyethyl methacrylate | 0.34 | 3.54 | 3.9 | 1.58 |
| Methyl methacrylate | — | — | 17.8 | Table 4 |
| 2% hydroxyethyl Cellulose | 3.4 | — | — | — |
| Surfactant | 0.15 | 2.49 | 2.5 | 0.9 |
| Sodium Acetate | 0.36 | — | — | — |
| H$_2$O | 50 | 84 | 90 | 39 |

TABLE 4

| Example # | 1 | 2 | 3 | 4 | 5 | 6 | 7 | 8 |
|---|---|---|---|---|---|---|---|---|
| Initial Charge | | | | | | | | |
| Styrene | 7.4 | 6.83 | 6.27 | 5.7 | 5.13 | 4.56 | 3.99 | 3.4 |
| Acrylonitrile | 0 | 0.57 | 1.13 | 1.7 | 2.27 | 2.84 | 3.41 | 4.0 |
| Pre-emulsion I | | | | | | | | |
| Styrene | 77.5 | 71.5 | 65.5 | 58.5 | 53.5 | 47.5 | 41.5 | 25.5 |
| Acrylonitrile | 0 | 6.0 | 12.0 | 18.0 | 24 | 30 | 36 | 42 |
| Pre-emulsion II | | | | | | | | |
| Styrene | 85.5 | 78.9 | 72.3 | 65.3 | 59.1 | 52.5 | 45.9 | 39.3 |
| Acrylonitrile | 0 | 6.6 | 13.2 | 19.7 | 26.4 | 33 | 39.6 | 46.2 |
| Pre-emulsion III | | | | | | | | |
| Acrylonitrile | 0 | 2.51 | 5.01 | 7.52 | 10.0 | 12.6 | 15.1 | 17.6 |
| MMA | 34.8 | 32.33 | 29.8 | 27.3 | 24.8 | 22.2 | 18.7 | 17.2 |

The Initial Charge was placed in a reactor and mixed for 30 minutes. Thereafter it was heated to 65° C. and a solution of 0.7 g ammonium persulfate, 3.3 g water containing 1% t-butylhydroperoxide was added. The contents of the reactor were then heated to 80° C. and allowed to cool to about 76° C. and Pre-Emulsion I was added drop-wise. A solution of 0.16 g ammonium persulfate, 1.5 g water and 1.35 g t-butylhydroperoxide was added and, thereafter, Pre-Emulsion II was added drop-wise over a period of 1.5 hours while the temperature was maintained at about 76° C. After the addition of Pre-Emulsion II, another solution of 0.16 g ammonium persulfate, 1.5 g water and 1.35 g t-butylhydroperoxide (1%) was added. After addition of the ammonium persulfate solution, Pre-Emulsion III was added at about 76° C. over a period of 1.5 hours. The contents of the reactor were then heated to about 80° C. for about 1.5 hour and allowed to cool to room temperature.

The acrylonitrile concentration ranged from 0 to 35% by weight in the series of emulsions prepared.

Emulsions prepared as above were blended with a phenolic resin available from Schenectady Chemical Corporation designated HRJ 4252 which is a condensation product of a phenol, formaldehyde and salicylic acid in a ratio of 30 parts (dry) emulsion to 70 parts (dry) phenolic resins. Blocking resistance was measured by placing a film of the blend in contact with a vinyl film under a two pound weight for seven or eleven days, separating the films and observing the film of the invention for blocking resistance. Blocking was evaluated by eye on a scale of 0 to 5 with 5 indicating a high amount of blocking and 0 indicating no blocking. Blocking resistance improves significantly with acrylonitrile content as shown in Table 5:

TABLE 5

| Acrylonitrile % | 7 Day Pick-off | 11 Day Pick-Off |
|---|---|---|
| 0 | 4 | 4 |
| 5 | 3 | 3 |
| 10 | 3 | 3 |
| 15 | 2 | 2 |
| 20 | 0 | 2 |
| 25 | 0 | 1.5 |
| 30 | 0 | 1 |
| 35 | 0 | 0.5 |

Increasing concentrations of acrylonitrile in the resin also reduced the dulling effect observed upon storage of the image between vinyl sheets as shown in the following Table 6.

TABLE 6

| Acrylonitrile % | 7 Day Dull Effect | 11 Day Dull Effect |
|---|---|---|
| 0 | 3 | 3 |
| 5 | 3 | 3 |
| 0 | 4 | 4 |
| 15 | 4 | 4 |
| 20 | 3 | 3 |
| 25 | 2 | 2 |
| 30 | 1.5 | 1.5 |
| 35 | 1 | 1.5 |

Seed Emulsion B was substituted for Seed Emulsion A and another acrylic emulsion was prepared by using the recipe described in Table 3, except sodium styrene sulfonate is now used instead of methacrylic acid and blended with a polyphenol prepared by the oxidative coupling of bisphenol A in the presence of horseradish peroxidase in ethyl acetate, acetone and water as described in U.S. Pat. No. 4,647,952. The resins were blended in a ratio of 30 parts (dry) acrylic to 70 parts (dry) phenolic and tested as above. The results are shown in Table 7.

TABLE 7

| Acrylonitrile % | 7-Day Pick Off | 11-Day Pick Off | 7-Day Dull Effect | 11 Day Dull Effect |
|---|---|---|---|---|
| 0 | 0 | 2 | 2 | 2 |
| 5 | 0 | 1.5 | 1.5 | 1.5 |
| 10 | 0 | 1.0 | 1.0 | 1.0 |
| 15 | 0 | 0.75 | 0.75 | 0.75 |
| 20 | 0 | 0 | 1.0 | 1.0 |
| 25 | 0 | 0 | 1.0 | 1.0 |
| 30 | 0 | 0 | 1.0 | 1.0 |
| 35 | 0 | 0 | 1.0 | 1.0 |

Having described the invention in detail and by reference to preferred embodiments thereof, it will be apparent that modifications and variations are possible without departing from the scope of the invention defined in the appended claims.

What is claimed is:

1. A process for forming images which comprises image-wise transferring a color precursor to the reactive surface of a developer sheet comprising a support having a layer of a developer composition on the surface thereof, said composition comprising first and second developer polymers, said first polymer being a finely divided thermoplastic phenolic resin and said second polymer being a finely divided thermoplastic vinylic or acrylic resin, said second polymer being prepared from a monomer composition containing a polar monomer and a polyfunctional monomer, and said first and second polymers being sufficiently compatible that upon heating they coalesce to form a film, said film having vinyl blocking resistance; and heating said developer sheet to coalesce said first and second polymers and thereby form said film.

2. The process of claim 1 where said monomer composition includes a monomer selected from the group consisting of acrylic acid, methacrylic acid, alkyl acrylates, alkyl methacrylates, hydroxy alkyl (meth)acrylates, styrene sulfonate salts, vinyl sulfonate salts, vinylbenzoic acid, acryloxloyl monophthalate, o-acryloxloyl benzoic acid, vinyl acetate, and vinylidene chloride.

3. The process of claim 2 wherein said polar monomer is acrylonitrile.

4. The process of claim 3 wherein said polyfunctional monomer is a difunctional monomer.

5. The process of claim 4 wherein said difunctional monomer is divinyl benzene.

6. The process of claim 5 wherein said monomer composition additionally includes styrene.

7. The process of claim 1 wherein the ratio of said first polymer to said second polymer is about 90/10 to 40/60 based on dry weight.

8. The process of claim 7 wherein said developer additionally contains 10 to 30% by weight of zinc salicylate.

9. The process of claim 1 wherein said second polymer is prepared by emulsion polymerization and has a core portion and a shell portion and said shell portion is formed from a vinylic or acrylic resin which is compatible with said first polymer.

10. The process of claim 9 wherein said core portion is formed from a polymer having a melt flow temperature which is less than the melt flow temperature of the polymer forming said shell portion.

11. The process of claim 10 wherein said first polymer is a metallated phenol-formaldehyde resin.

12. The process of claim 10 wherein said first polymer is formed by oxidatively coupling a phenol or a biphenol.

13. The process of claim 1 wherein said first polymer and said second developer material have a particle size of about 0.5 to 25 microns.

14. The process of claim 1 wherein said acrylic or vinylic polymer has a melt flow temperature of about 80° C. to 130° C.

15. The process of claim 14 wherein said first polymer and said second polymer exhibit a minimum film-forming temperature greater than 60° C.

16. The process of claim 1 wherein said step of image-wise transferring said color precursor includes exposing to actinic radiation a photosensitive material comprising a support having a layer of microcapsules on the surface thereof, said microcapsules containing a photohardenable composition and a color precursor, subjecting said layer microcapsules to a uniform rupturing force such that said microcapsules image-wise release said color precursor to said developer material whereupon an image is formed.

17. The process of claim 16 wherein said microcapsules are present on said developer sheet.

18. The process of claim 16 wherein said layer of microcapsule is present on a sheet separate and distinct from said developer sheet.

19. A developer sheet comprising a support having a layer of a developer composition on the surface thereof, said developer composition comprising first and second polymers, said first polymer being a finely divided thermoplastic phenolic resin and said second polymer being a finely divided thermoplastic vinylic or acrylic resin, said second polymer being prepared from a monomer composition containing a polar monomer and a polyfunctional monomer, and said first and second polymers being sufficiently compatible that upon heating they coalesce to form a continuous film, said film having vinyl blocking resistance.

20. A photosensitive recording material including the developer sheet of claim 19.

21. The developer sheet of claim 19 wherein said monomer composition includes a monomer selected from the group consisting of acrylic acid, methacrylic acid, alkyl acrylates, alkyl methacrylates, hydroxy alkyl (meth)acrylates, styrene sulfonate salts, vinyl sulfonate salts, vinylbenzoic acid, acryloxloyl monophthalate, o-acryloxloyl benzoic acid, vinyl acetate, and vinylidene chloride.

22. The developer sheet of claim 21 wherein said polar monomer is acrylonitrile.

23. The developer sheet of claim 22 wherein said polyfunctional monomer is a difunctional monomer.

24. The developer sheet of claim 23 wherein said difunctional monomer is divinylbenzene.

25. The developer sheet of claim 24 wherein said monomer composition additionally includes styrene.

26. The developer sheet of claim 24 wherein the ratio of said first developer material to said second developer material is about 90/10 to 40/60 based on dry weight.

27. The developer sheet of claim 19 wherein said second developer material is prepared by emulsion polymerization and has a core portion and a shell portion and said shell portion is formed from a vinylic or acrylic resin which is compatible with said first developer material.

28. The developer sheet of claim 27 wherein said core portion is formed from a polymer having a melt flow temperature which is less than the melt flow temperature of the polymer forming said shell portion.

29. The developer sheet of claim 28 wherein said first developer material is a metallated phenol-formaldehyde resin.

30. The developer sheet of claim 28 wherein said first developer material is formed by oxidatively coupling a phenol or a biphenol.

31. The developer sheet of claim 19 wherein said first developer material and said second developer material have a particle size of about 0.1 to 25 microns.

32. The developer sheet of claim 19 wherein said acrylic or vinylic polymer has a melt flow temperature of about 80° C. to 130° C.

33. The developer sheet of claim 32 wherein said first developer material and said second developer material exhibit a minimum film-forming temperature greater than 60° C.

* * * * *